United States Patent
Lim

(10) Patent No.: US 8,530,919 B2
(45) Date of Patent: Sep. 10, 2013

(54) SEMI-CONDUCTOR LIGHT-EMITTING DEVICE

(75) Inventor: Woo Sik Lim, Seoul (KR)

(73) Assignee: LG Innotek, Co., Ltd., Seoul (KR)

( * ) Notice: Subject to any disclaimer, the term of this patent is extended or adjusted under 35 U.S.C. 154(b) by 282 days.

(21) Appl. No.: 12/992,950

(22) PCT Filed: May 15, 2009

(86) PCT No.: PCT/KR2009/002596
§ 371 (c)(1), (2), (4) Date: Nov. 16, 2010

(87) PCT Pub. No.: WO2009/139603
PCT Pub. Date: Nov. 19, 2009

(65) Prior Publication Data
US 2011/0062480 A1 Mar. 17, 2011

(30) Foreign Application Priority Data
May 16, 2008 (KR) ........................ 10-2008-0045740

(51) Int. Cl.
*H01L 33/60* (2010.01)

(52) U.S. Cl.
USPC ......... 257/98; 257/79; 257/103; 257/E33.068

(58) Field of Classification Search
USPC ......... 257/9–39, E29.069–E29.071, E29.245, 257/E49.001–E49.004
See application file for complete search history.

(56) References Cited

U.S. PATENT DOCUMENTS

| | | |
|---|---|---|
| 6,891,871 B1 | 5/2005 | Nomura et al. |
| 2003/0141506 A1 | 7/2003 | Sano et al. |
| 2006/0065901 A1 | 3/2006 | Aoyagi et al. |
| 2006/0261323 A1 | 11/2006 | Suh et al. |
| 2008/0006836 A1 | 1/2008 | Lee |
| 2008/0048206 A1 | 2/2008 | Lee et al. |
| 2009/0294784 A1 | 12/2009 | Nakahara et al. |

FOREIGN PATENT DOCUMENTS

| | | |
|---|---|---|
| CN | 101084583 | 12/2007 |
| EP | 2 219 238 | 8/2010 |
| EP | 2 257 997 | 12/2010 |
| WO | WO 2007/055202 | 5/2007 |
| WO | WO 2009/117845 | 10/2009 |

OTHER PUBLICATIONS

International Search Report dated Dec. 18, 2009.
Chinese Office Action dated May 4, 2012.
European Search Report dated Sep. 6, 2012.

*Primary Examiner* — Mamadou Diallo
(74) *Attorney, Agent, or Firm* — KED & Associates LLP

(57) ABSTRACT

Disclosed is a semiconductor light emitting device. The semiconductor light emitting device includes a first conductive semiconductor layer, an active layer under the first conductive semiconductor layer, a second conductive semiconductor layer under the active layer, a second electrode layer under the second conductive semiconductor layer; and an insulating layer on an outer peripheral surface of at least two layers of the first conductive semiconductor layer, the active layer, and the second conductive semiconductor layer.

16 Claims, 6 Drawing Sheets

SEMI-CONDUCTOR LIGHT-EMITTING DEVICE

TECHNICAL FIELD

The embodiment relates to a semiconductor light emitting device.

BACKGROUND ART

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of an illumination device or a display device. Particularly, a light emitting device including the group III nitride semiconductor has a direct fundamental band gap corresponding to a visible ray band to an ultra-violet band so that high light emission efficiency can be realized.

The nitride semiconductor is mainly used for the LED (Light Emitting Diode) or an LD (laser diode), and studies have been continuously conducted to improve the manufacturing process or a light efficiency of the nitride semiconductor.

DISCLOSURE

Technical Problem

The embodiment provides a semiconductor light emitting device including an insulating layer formed on an outer peripheral surface of a plurality of conductive semiconductor layers.

The embodiment provides a semiconductor light emitting device in which a second electrode layer is provided under a light emitting structure, and an insulating layer is provided on outer peripheral surface of at least one of semiconductor layers of the light emitting structure.

The embodiment provides a semiconductor light emitting device in which an insulating layer is provided on an outer peripheral surface of a light emitting structure and a passivation layer is provided on an outer peripheral surface of a top surface of the second electrode layer.

Technical Solution

According to the embodiment, a semiconductor light emitting device includes a first conductive semiconductor layer, an active layer under the first conductive semiconductor layer, a second conductive semiconductor layer under the active layer, a second electrode layer under the second conductive semiconductor layer; and an insulating layer on an outer peripheral surface of at least two layers of the first conductive semiconductor layer, the active layer, and the second conductive semiconductor layer.

According to the embodiment, a semiconductor light emitting device includes a light emitting structure including a first conductive semiconductor layer, an active layer under the first conductive semiconductor layer, and a second conductive semiconductor layer under the active layer, a first electrode on the first conductive semiconductor layer, a second electrode layer under the second conductive semiconductor layer, and an insulating layer on an outer peripheral surface of both of the active layer and the second conductive semiconductor layer.

ADVANTAGEOUS EFFECTS

According to the embodiment, current can be prevented from leaking out of the light emitting structure.

According to the embodiment, the adhesion strength with the second electrode layer can be improved by using the insulating layer.

According to the embodiment, an additional photolithography process for the second electrode layer can be removed, so that the manufacturing process can be simplified.

According to the embodiment, the electrical reliability for the semiconductor light emitting device can be improved.

MODE FOR INVENTION

Figure 1:
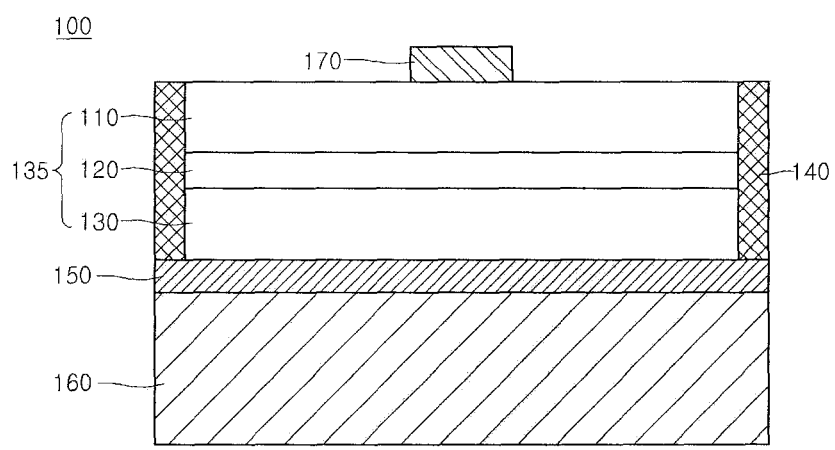
FIG. 1 is a side sectional view showing a semiconductor light emitting device according to a first embodiment.

Hereinafter, a semiconductor light emitting device according to the embodiments will be described in detail with reference to accompanying drawings. In the following description, the thickness and size of each layer shown in the drawings can be exaggerated, omitted or schematically drawn for the purpose of convenience or clarity. In addition, the top or the bottom of each layer will be determined on the basis of the drawings.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

FIG. 1 is a side sectional view showing a semiconductor light emitting device according to a first embodiment.

Referring to FIG. 1, the semiconductor light emitting device 100 includes a first conductive semiconductor layer 110, an active layer 120, a second conductive semiconductor layer 130, an insulating layer 140, a second electrode 150, and a conductive support member 160.

The semiconductor light emitting device 100 includes LEDs made of group III-V compound semiconductors, and the LEDs may include color LEDs to emit blue, green or red light, or UV LEDs. The emission light of the LEDs may be variously realized within the technical scope of the embodiment.

The first conductive semiconductor layer 110 may include compound semiconductors of group III-V elements doped with first conductive dopants. For instance, the first conductive semiconductor layer 110 may be selected from the group consisting of GaN, AlN, AlGaN, InGaN, InN, InAlGaN, AlInN, AlGaAs, GaP, GaAs, GaAsP, and AlGaInP.

If the first conductive semiconductor layer 110 includes an N type semiconductor layer, the first conductive dopant may include an N type dopant such as Si, Ge, Sn, Se, or Te. The first conductive semiconductor layer 110 may serve as an electrode contact layer, and may have a single-layer structure or a multi-layer structure, but the embodiment is not limited thereto.

A first electrode 170 is formed on the first conductive semiconductor layer 110, and the first electrode 170 supplies power having first polarity. A roughness (not shown) having a predetermined shape may be formed on a top surface of the first conductive semiconductor layer 110, and the roughness may be additionally provided or modified within the technical scope of the embodiment.

In addition, a transmissive electrode layer (not shown) may be formed on the first conductive semiconductor layer 110, and spreads the power having the first polarity, which has been supplied by the first electrode 170, onto the whole region. The transmissive electrode layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO.

The active layer 120 is formed under the first conductive semiconductor layer 110, and may have a single quantum well structure or a multiple quantum well structure. The active layer 120 may have a stack structure including a well layer and a barrier layer, which are made from group III-V compound semiconductor material. For instance, the active layer 120 may have a stack structure of InGaN well/GaN barrier layers.

The active layer 120 is made of material having band gap energy according to wavelengths of light to be emitted. The active layer 120 may include material capable of providing color light such as blue light, red light, or green light, but the embodiment is not limited thereto. A conductive clad layer may be formed on and/or under the active layer 120. The conductive clad layer may include an AlGaN layer.

The second conductive semiconductor layer 130 is provided under the active layer 120. The second conductive semiconductor layer 130 may include compound semiconductors of group III-V elements doped with the second conductive dopant. For instance, the second conductive layer 130 may be selected from the group consisting of GaN, AlN, AlGaN, InGaN, InN, InAlGaN, AlInN, AlGaAs, GaP, GaAs, GaAsP, and AlGaInP. If the second conductive semiconductor layer 130 is a P type semiconductor layer, the second conductive dopant includes a P type dopant such as Mg or Ze. The second conductive semiconductor layer 130 may serve as an electrode contact layer, and may have a single-layer structure or a multi-layer structure, but the embodiment is not limited thereto.

The first conductive semiconductor layer 110, the active layer 120, and the second conductive semiconductor layer 130 may be defined as a light emitting structure 135. The first conductive semiconductor layer 110 may include a P type semiconductor, and the second conductive semiconductor layer 130 may include an N type semiconductor. A third conductive semiconductor layer such as an N type semiconductor layer or a P type semiconductor layer may be formed under the second conductive semiconductor layer 130. Accordingly, the light emitting structure 135 may include at least one of an N—P junction structure, a P—N junction structure, an N—P—N junction structure and a P—N—P junction structure.

The insulating layer 140 is fanned on an outer peripheral surface of the light emitting structure 135. The insulating layer 140 serves as a sidewall on the outer peripheral surface of the second conductive semiconductor layer 130, the active layer 120, and the first conductive semiconductor layer 110. The insulating layer 140 may be fanned in the shape of a band or a ring.

The insulating layer 140 may include insulating material such as $SiO_2$, $Si_3N_4$, $Al_2O_3$, or $TiO_2$, but the embodiment is not limited thereto.

The insulating layer 140 may be formed as a sidewall on an outer peripheral surface of at least one semiconductor layer. For instance, the insulating layer 140 may be formed on an outer peripheral surface of the active layer 120 or both the second conductive semiconductor layer 130 and the active layer 120.

In addition, an upper end of the insulating layer 140 may extend to a lower portion of the first conductive semiconductor layer 110. A lower end of the insulating layer 140 may extend downward beyond the second conductive semiconductor layer 130.

The insulating layer 140 may have a thickness less than or equal to that of the light emitting structure 135, or may have a thickness greater than or equal to that of the light emitting structure 135.

The second electrode layer 150 may be formed under the second conductive semiconductor layer 130, or may extend to a lower portion of the insulating layer 140.

The second electrode layer 150 may include Ag, Ni, Al, Rh, Pd, Ir, Ru, Mg, Zn, Pt, Au, Hf, or the combination thereof. The second electrode layer 150 may include reflective electrode material having 50% or more of a reflective rate.

An ohmic contact layer (not shown) having a plurality of patterns arranged in the form of a matrix and/or a layer may be interposed between the second electrode layer 150 and the second conductive semiconductor layer 130. The ohmic contact layer includes at least one selected from the group consisting of ITO, IZO, AZO, IZTO, IAZO, IGZO, IGTO, and ATO.

The second electrode layer 150 may make schottky contact with the second conductive semiconductor layer 130 or make ohmic contact with the second conductive semiconductor layer 130. If an ohmic contact layer having a pattern exists between the second electrode layer 150 and the second conductive semiconductor layer 130, the second electrode layer 150 may make schottky contact with the second conductive semiconductor layer 130, and the ohmic contact layer makes ohmic contact with the second conductive semiconductor layer 130. Accordingly, since the second electrode layer 150 has an electric characteristic different from that of the ohmic contact layer, current supplied to the second conductive semiconductor layer 130 can be diffused.

The second electrode layer 150 stably supplies power having the second polarity to the light emitting structure 135, and reflects light incident through the second conductive semiconductor layer 130.

The conductive support member 160 is formed under the second electrode layer 150. The second conductive support member 160 may be realized by using Cu, Au, Ni, Mo, Cu—W, and carrier wafers such as Si, Ge, GaAs, ZnO, and SiC. The conductive support member 160 may be formed through an electroplating process, but the embodiment is not limited thereto.

The second electrode layer 150 and the conductive support member 160 may be used as a second electrode part to supply power having the second polarity to the light emitting structure 135. The second electrode part may include electrode material in a single-layer structure or a multiple-layer structure, or may be bonded to a lower portion of the second conductive semiconductor layer 130 by using an adhesive agent.

In the semiconductor light emitting device 100, the insulating layer 140 is provided at an outer portion of the light emitting structure 135, thereby preventing residual materials or external moisture from infiltrating into an outer portion of the light emitting structure 135. Accordingly, electrical short among the semiconductor layers 110, 120, and 130 can be prevented from occurring at the outer portion of the semiconductor light emitting device 100.

The insulating layer 140 is provided at an outer portion of the light emitting structure 135, thereby preventing current from leaking out of the light emitting structure 135. For instance, current applied through the second electrode layer 150 has tendency to be directed to the outside of the light emitting structure 135. However, such current is shut off by the insulating layer 140, so that current injection efficiency can be improved.

The insulating layer 140 is provided at outer portions of the second electrode layer 150 and the second conductive semiconductor layer 130, so that the adhesion strength of the second electrode layer 150 can be improved.

FIGS. 2 to 9 are sectional views showing the manufacturing process of the semiconductor light emitting device according to the first embodiment.

Figure 2:
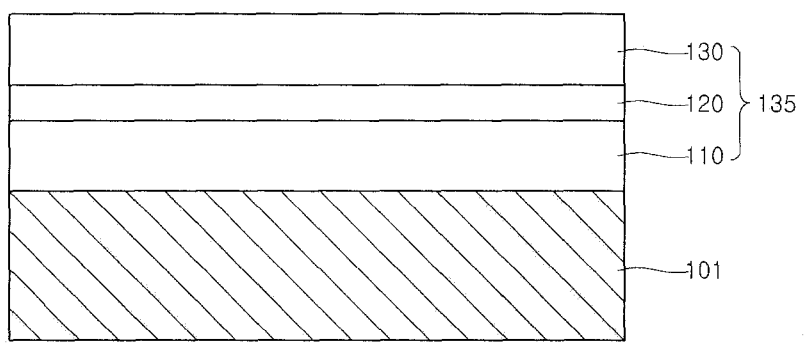
FIGS. 2 to 9 are side sectional views showing the manufacturing process of the semiconductor light emitting device according to the first embodiment of FIG. 1.

Referring to FIG. 2, the first conductive semiconductor layer 110 is formed on a substrate 101, and the active layer 120 is formed on the first conductive semiconductor layer 110. The second conducive semiconductor layer 130 is formed on the active layer 120.

The substrate 101 may be selected from the group consisting of a sapphire substrate ($Al_2O_3$), GaN, SiC, ZnO, Si, GaP, InP, $Ga_2O_3$, and GaAs. A concave-convex pattern may be formed on the surface of the substrate 101, but the embodiment is not limited thereto.

A group III-V compound semiconductor may be grown on the substrate 101, and growth equipment may be selected from the group consisting of an E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited thereto.

A buffer layer (not shown) and/or an undoped semiconductor layer (not shown) may be formed between the substrate 101 and the first conductive semiconductor layer 110 by using a compound semiconductor of group III-V elements, and may be separated or removed from the substrate 101 after a thin film has been grown. The buffer layer can reduce a lattice constant mismatch with respect to the substrate 101, and the undoped semiconductor layer may be a base to grow a compound semiconductor layer.

The first conductive semiconductor layer 110 may include a compound semiconductor of group III-V elements doped with the first conductive dopant. For example, the first conductive semiconductor layer 110 may be selected from the group consisting of GaN, AlN, AlGaN, InGaN, InN, InAlGaN, AlInN, AlGaAs, GaP, GaAs, GaAsP, and AlGaInP. If the first conductive semiconductor layer 110 is an N-type semiconductor layer, the first conductive dopant includes an N type dopant such as Si, Ge, Sn, Se, or Te. The first conductive semiconductor layer 110 may serve as an electrode contact layer, and may have a single-layer structure or a multiple-layer structure. However, the embodiment is not limited thereto.

The active layer 120 may have a single quantum well structure or a multiple quantum well structure. The active layer 120 may have a stack structure including well and barrier layers which are made of a compound semiconductor of group III-V elements. For instance, the active layer 120 may have a stack structure of InGaN well/GaN barrier layers. A conductive clad layer may be formed on and/or under the active layer 120, and may include an AlGaN layer.

The second conductive semiconductor layer 130 is formed on the active layer 120. The second conductive semiconductor layer 130 may include a compound semiconductor of group III-V elements doped with the second conductive dopant. For instance, the second conductive semiconductor layer 130 may be selected from the group consisting of GaN, AlN, AlGaN, InGaN, InN, InAlGaN, AlInN, AlGaAs, GaP, GaAs, GaAsP, and AlGaInP. If the second conductive semiconductor layer 130 is a P type semiconductor layer, the second conductive dopant is a P type dopant such as Mg or Ze. The second conductive semiconductor layer 130 may serve as an electrode contact layer, and may have a single-layer structure or a multi-layer structure, but the embodiment is not limited thereto.

The first conductive semiconductor layer 110, the active layer 120, and the second conductive semiconductor layer 130 may be defined as the light emitting structure 135. The first conductive semiconductor layer 110 may include a P type semiconductor, and the second conductive semiconductor layer 130 may include an N type semiconductor. A third conductive semiconductor layer such as an N type semiconductor layer or a P type semiconductor layer may be formed on the second conductive semiconductor layer 130. Accordingly, the light emitting structure 135 may include at least one of an N—P junction structure, a P—N junction structure, an N—P—N junction structure, and a P—N—P junction structure.

Figure 3:
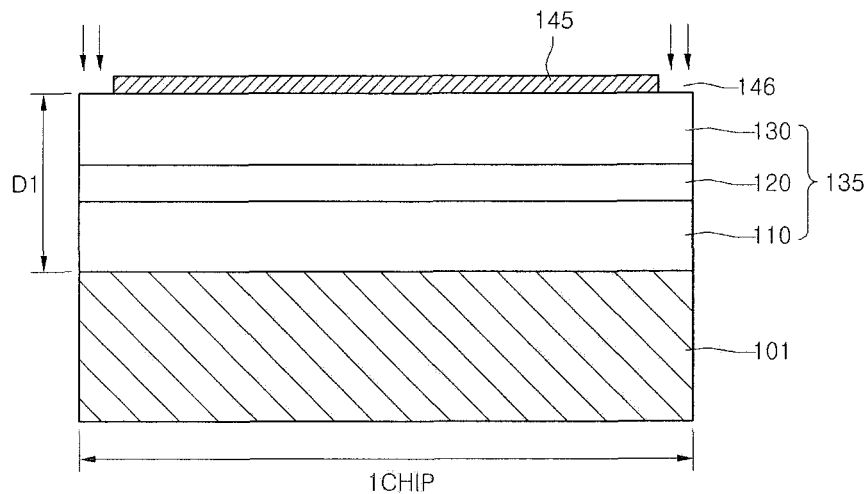
Figure 4:
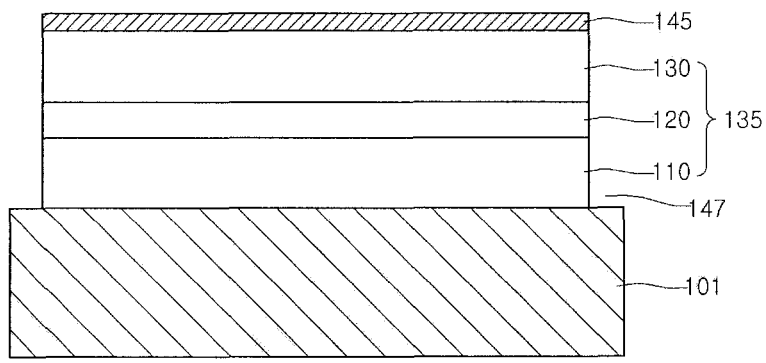

Referring to FIGS. 3 and 4, a mask layer 145 is formed on an inner region (light emission region) of the second conductive semiconductor layer 130.

The mask layer 145 is formed on the second conductive semiconductor layer 130 through a photolithography process, and an outer peripheral surface 146 of the second conductive semiconductor layer 130 may be etched in a predetermined mask pattern. Accordingly, the mask layer 145 is formed at the inner region of the second conductive semiconductor layer 130 except for the outer peripheral surface 146 of the second conductive semiconductor layer 130. To form the mask layer 145, various schemes may be used within the technical scope of the embodiment. However, the embodiment is not limited thereto.

A first mesa etching process may be performed with respect to the outer peripheral surface 146 of the second conductive semiconductor layer 130. The first mesa etching process may include a dry and/or wet etching process. Equipment for the dry etching process includes an ICP (Inductively Coupled Plasma), but the embodiment is not limited thereto.

The etching depth D1 of the first mesa etching process may correspond to a depth from the second conductive semiconductor layer 130 to a position in which the substrate 101 or the first conductive semiconductor layer 110 is exposed. The etching depth D1 of the first mesa etching process may be formed with respect to at least one of the semiconductor layers 130, 120, and 110 of the light emitting structure 135 or all of the semiconductor layers 130, 120, and 110.

Figure 5:
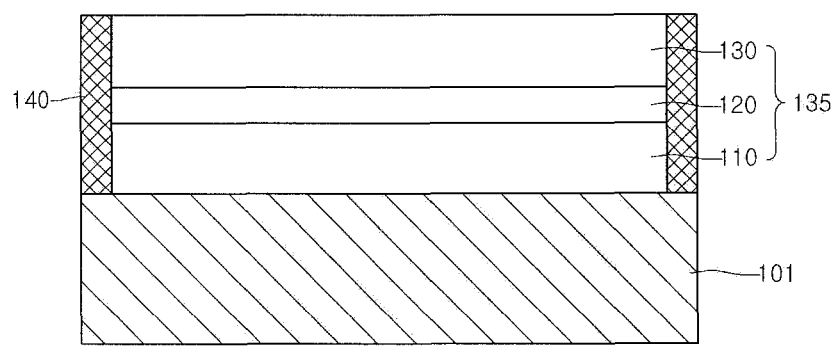

Referring to FIGS. 4 and 5, the insulating layer 140 is formed at a region 147 which has been formed through the first mesa etching process. The insulating layer 140 may include insulating material such as $SiO_2$, $Si_3N_4$, $Al_2O_3$, or $TiO_2$, but the embodiment is not limited thereto.

The insulating layer 140 is formed as a sidewall on the outer peripheral surface of the second conductive semiconductor layer 130, the active layer 120, and the first conductive semiconductor layer 110, and may be formed in the shape of a band or a ring.

The insulating layer 140 is provided at on the outer peripheral surface of the semiconductor layers 130, 120, and 110, thereby preventing residual material or external moisture from infiltrating into outer portions of the semiconductor layers 130, 120, and 110. Accordingly, electrical short can be prevented from occurring among the semiconductor layers 110, 120, and 130.

The upper end of the insulating layer 140 may protrude upward beyond the second conductive semiconductor layer 130. The insulating layer 140 may have a thickness less than or equal to that of the light emitting structure 135, or may have a thickness greater than or equal to that of the light emitting structure 135.

After the insulating layer 140 has been formed, the mask layer (see 145 of FIG. 3) is removed.

Figure 6:
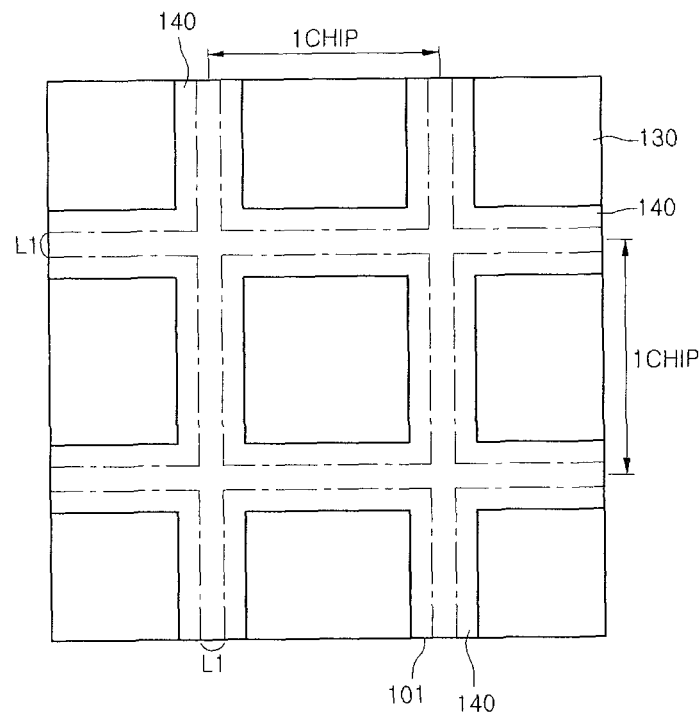

FIG. 6 is a plan view showing a plurality of chip regions. The insulating layer 140 may be formed in the shape of a polygonal band or ring on the outer peripheral surface of each chip. A central line L1 of the insulating layer 140 becomes a chip boundary region used to cut the substrate 101 in chip size.

Figure 7:
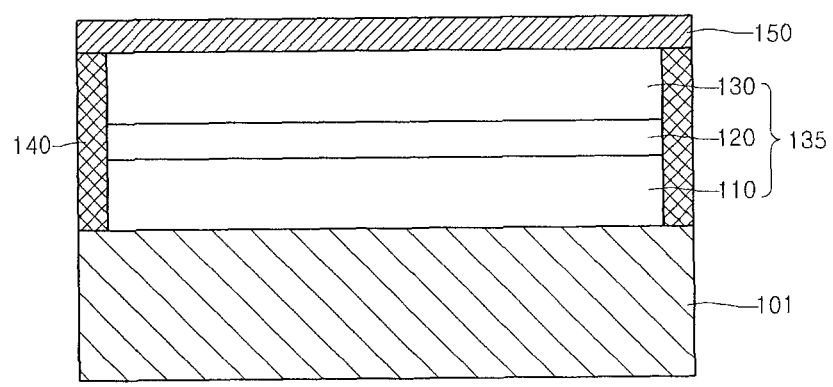

Referring to FIG. 7, the second electrode layer 150 is formed on the second conductive semiconductor layer 130. The second electrode layer 150 may be formed on the second conductive semiconductor layer 130, or may be formed on the second conductive semiconductor layer 130 and the insulating layer 140.

The second electrode layer 150 may include Ag, Ni, Al, Rh, Pd, Ir, Ru, Mg, Zn, Pt, Au, Hf, or the combination thereof. In this case, the second electrode layer 150 may include reflective electrode material having 50% or more of a reflective rate.

An ohmic contact layer (not shown) having a plurality of patterns arranged in the form of a matrix and/or a layer may be interposed between the second electrode layer 150 and the second conductive semiconductor layer 130. The ohmic contact layer includes at least one selected from the group consisting of ITO, IZO, AZO, IZTO, IAZO, IGZO, IGTO, and ATO.

The second electrode layer 150 may make schottky contact with the second conductive semiconductor layer 130 or may make ohmic contact with the second conductive semiconductor layer 130. If an ohmic contact layer having a pattern exists between the second electrode layer 150 and the second conductive semiconductor layer 130, the second electrode layer 150 makes schottky contact with the second conductive semiconductor layer 130, and the ohmic contact layer makes ohmic contact with the second conductive semiconductor layer 130. Accordingly, since the second electrode layer 150 has an electric characteristic different from that of the ohmic contact layer, current supplied to the second conductive semiconductor layer 130 can be diffused.

The second electrode layer 150 stably supplies power having the second polarity to the light emitting structure 135, and reflects light incident through the second conductive semiconductor layer 130.

Figure 8:
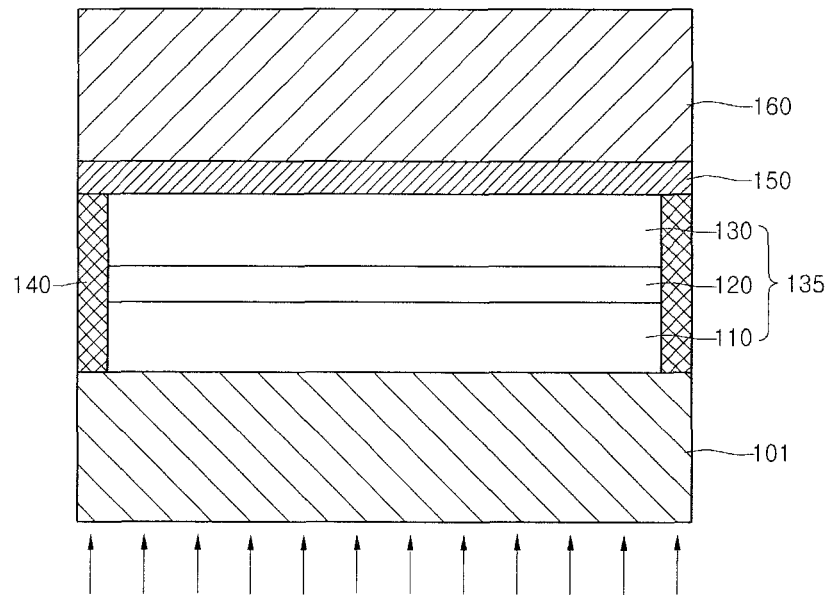

Referring to FIG. 8, the conductive support member 160 is formed on the second electrode layer 150. The second conductive support member 160 may be realized by using Cu, Au, Ni, Mo, Cu—W, and carrier wafers such as Si, Ge, GaAs, ZnO, and SiC. The conductive support member 160 may be formed through an electroplating process, but the embodiment is not limited thereto.

The second electrode layer 150 and the conductive support member 160 may be used as the second electrode part to supply power having the second polarity to the light emitting structure 135. The second electrode part may include electrode material having a single-layer structure or a multiple-layer structure, or may be bonded to a lower portion of the second conductive semiconductor layer 130 by using an adhesive agent.

When the conductive support member 160 has been formed, the resultant structure is turned over such that the substrate 101 is located at the uppermost layer and the conductive support member 160 serves as a base.

The substrate 101 is separated from the first conductive semiconductor layer 110 by irradiating a laser beam having a predetermined wavelength through the substrate 101. In other words, the substrate 101 may be removed through an LLO (Laser Lift Off) process. If another semiconductor layer (e.g., buffer layer) is formed between the substrate 101 and the first conductive semiconductor layer 110, the buffer layer is removed through a wet etching scheme, thereby separating the substrate 101 from the first conductive semiconductor layer 110. The substrate removing scheme is only one example, and the substrate 101 may be removed through various schemes.

In addition, the insulating layer 140 is provided at outer portions of the second conductive semiconductor layer 130 and the second electrode layer 150, so that adhesion strength between the second conductive semiconductor layer 130 and the second electrode layer 150 can be enhanced. Accordingly, the second conductive semiconductor layer 130 and the second electrode layer 150 can be protected from external impact. Therefore, the electrical reliability for the semiconductor light emitting device can be improved.

In addition, the insulating layer 140 can reduce impact caused by a laser beam when the laser beam is transmitted.

The surface of the first conductive semiconductor layer 110 without the substrate 101 may be polished through ICP/RIE (Inductively coupled Plasma/Reactive Ion Etching).

A roughness may be formed on the surface of the first conductive semiconductor layer 110.

Figure 9:
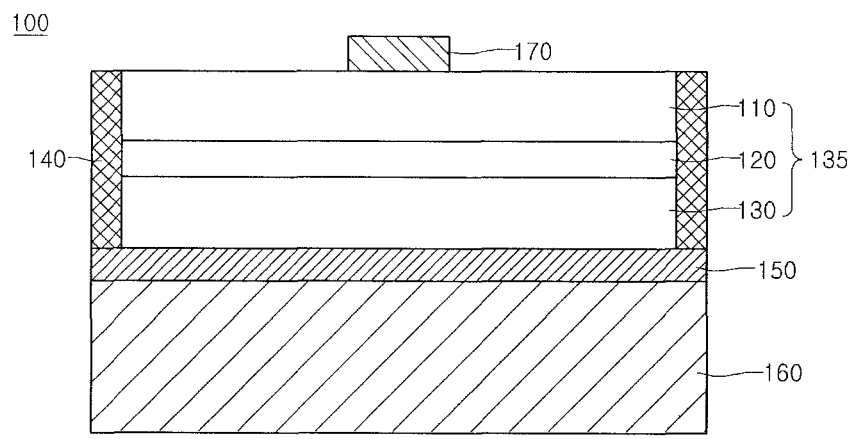

Referring to FIG. 9, the first electrode 170 is formed on the first conductive semiconductor layer 110.

In this case, a second mesa etching process is performed. The second mesa etching process is to etch the central portion of the insulating layer 140 provided on the outer peripheral surface of each chip. In other words, the second mesa etching process is performed along the chip boundary line L1 at a predetermined depth. The second mesa etching process may include a dry etching scheme or a wet etching scheme.

The first electrode 170 may be formed before or after the first mesa etching process is performed. Before the first electrode 170 is formed, a transmissive conductive layer (not shown) including ITO may be formed on the first conductive semiconductor layer 110. The transmissive conductive layer diffuses current supplied through the first electrode 170.

After the second mesa etching process has been performed, the structure is divided to an individual chip through a breaking process.

Since the insulating layer 140 is etched through the second mesa etching process, electrical short caused by the etching for the semiconductor material can be prevented. In other word, the stability of the manufacturing process can be improved. Accordingly, light emission efficiency can be improved by the ohmic characteristic of the insulating layer 140.

Since the insulating layer 140 has been formed, an additional insulating layer to protect an outer portion of the light emitting structure 135 from an external environment is omitted.

Figure 10:
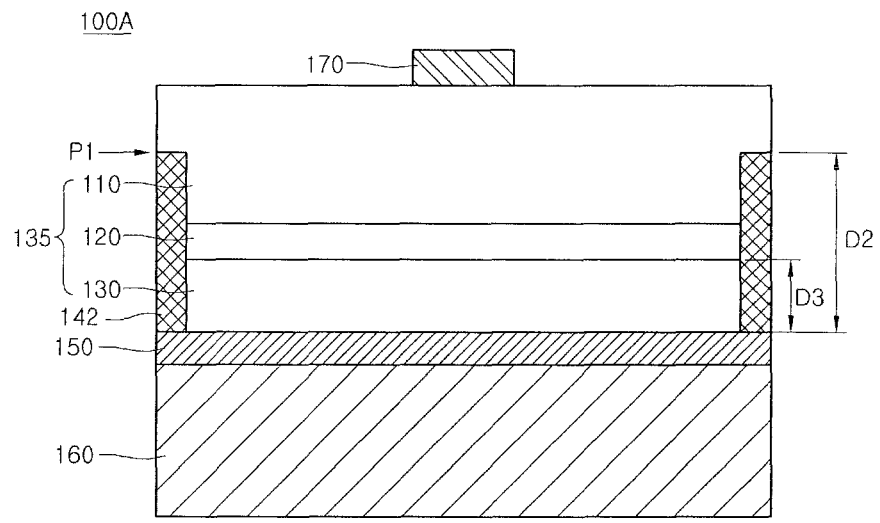
FIG. 10 is a side sectional view showing a semiconductor light emitting device according to a second embodiment.

FIG. 10 is a side sectional view showing a semiconductor light emitting device according to a second embodiment. Hereinafter, the second embodiment will be described while focusing on the difference from the first embodiment in order to avoid redundancy.

Referring to FIG. 10, a semiconductor light emitting device 100A includes an insulating layer 142 formed on an outer peripheral surface of the light emitting structure 135. The insulating layer 142 may be formed at a thickness D2 from the second conductive semiconductor layer 130 to a portion of the first conductive semiconductor layer 110. The insulating layer 142 can perform a function the same as that of the insulating layer 140 according to the first embodiment even if the insulating layer 142 is not formed over the whole area of an outer portion of the first conductive semiconductor layer 110.

A point P1 of an upper end of the insulating layer 142 may vary according to the etching depth of the first mesa etching process.

In addition, the insulating layer 142 may be formed at a thickness D3 less than or equal to that of the active layer 120. For example, the insulating layer 142 may be formed from the active layer 120 to the second conductive semiconductor layer 130 or the third conductive semiconductor layer (not shown).

In the semiconductor light emitting device 100A, the insulating layer 142 has material, a function, and an effect the same as those of the insulating layer 140 according to the first embodiment.

Figure 11:
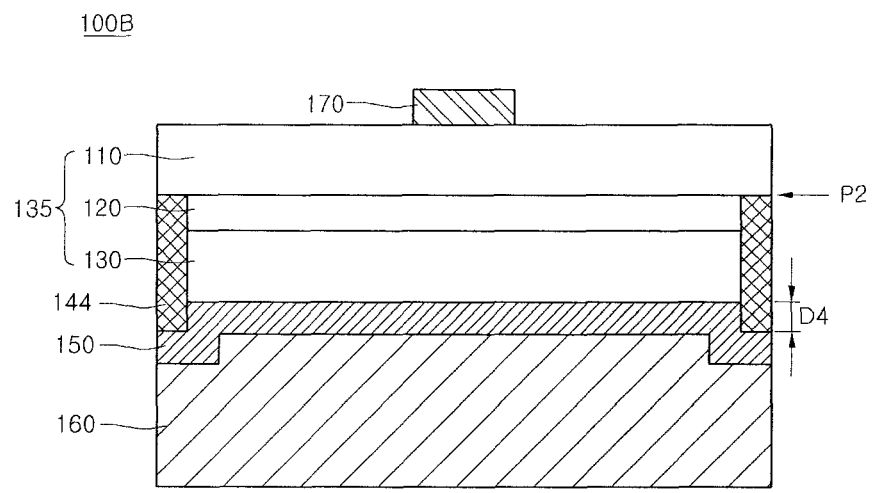
FIG. 11 is a side sectional view showing a semiconductor light emitting device according to a third embodiment.

FIG. 11 is a side sectional view showing a semiconductor light emitting device according to a third embodiment. Hereinafter, the third embodiment will be described while focusing on the difference from the first embodiment in order to avoid redundancy.

Referring to FIG. 11, the semiconductor light emitting device 100B includes an insulating layer 144 formed on an outer peripheral surface of the light emitting structure 135 and the second electrode layer 150.

The insulating layer 144 may be formed on an outer peripheral surface of the active layer 120, the second conductive semiconductor layer 130, and the second electrode layer 150.

The insulating layer 144 may protrude downward from the second conductive semiconductor layer 130 at a predetermined thickness D4, so that the insulating layer 144 may be provided at an outer portion of the second electrode layer 150.

The second electrode layer 150 may be formed under the second conductive semiconductor layer 130, or may be formed under both of the second conductive semiconductor layer 130 and the insulating layer 144.

Since the insulating layer 144 places the outer portion of the second electrode layer 150 at a lower position to more increase the distance between the second electrode layer 150 and the semiconductor layers 110, 120, and 130. The above structure can improve the electrical reliability for the semiconductor light emitting device 100B.

An upper end of the insulating layer 144 may extend to a portion of the first conductive semiconductor layer 110 or an upper end of the first conductive semiconductor layer 110, but the embodiment is not limited thereto.

In the semiconductor light emitting device 100B, the insulating layer 144 has material, a function, and an effect the same as those of the insulating layer 140 according to the first embodiment.

Figure 12:
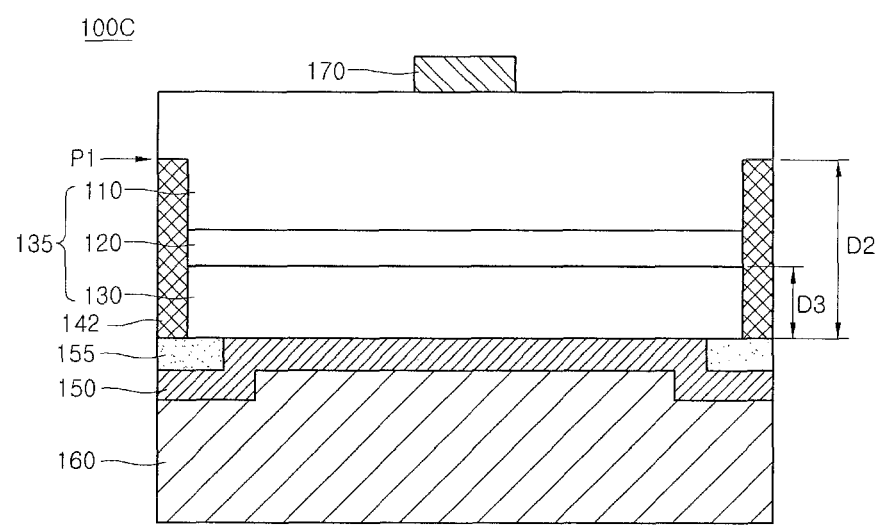
FIG. 12 is a side sectional view showing a semiconductor light emitting device according to a fourth embodiment.

FIG. 12 is a side sectional view showing a semiconductor light emitting device according to a fourth embodiment. Hereinafter, the fourth embodiment will be described while focusing on the difference from the first and second embodiments in order to avoid redundancy.

Referring to FIG. 12, a semiconductor light emitting device 100C includes the insulating layer 142 formed on an outer peripheral surface of the light emitting structure 135, and includes a passivation layer 155 formed on an outer peripheral surface of a top surface of the second electrode layer 150.

The passivation layer 155 may be formed in the shape of a band or a ring along an outer peripheral surface between the second electrode 150 and the insulating layer 142. The passivation layer 155 may make contact with an outer peripheral surface of a bottom surface of the second conductive semiconductor layer 130. If the passivation layer 155 includes conductive material, the electrical characteristic of the passivation layer 155 can be used.

In addition, the passivation layer 155 may include insulating material the same as that of the insulating layer 142 or may include a transmissive conductive layer. If the passivation layer 155 is the transmissive conductive layer, the passivation layer 155 may include ITO, IZO, AZO, IZTO, IAZO, IGZO, IGTO, or ATO.

Since the passivation layer 155 is formed at a chip boundary region, the passivation layer 155 can minimize the impact transferred to the light emitting structure 135 when the substrate is separated. If the passivation layer 155 is a transmissive conductive layer, the passivation layer 155 can reduce the width of the insulating layer 142 to increase the light emission area.

The technical characteristics of each embodiment are applicable to another embodiment, and are not limited to each embodiment.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

INDUSTRIAL APPLICABILITY

The embodiment can provide a semiconductor light emitting device such as an LED.

The embodiment can improve the reliability for the manufacturing process of the semiconductor light emitting device.

According to the embodiment, a light source formed by packaging the semiconductor light emitting device is applicable to various fields such as lighting, indicators, and displays.

The invention claimed is:

1. A light emitting device, comprising:
a first semiconductor layer of a first conductivity type;
a second semiconductor layer of a second conductivity type;
an active layer between the first and second semiconductor layers; and
an insulating layer surrounding side surfaces of the active layer and at least one of the first or second semiconductor layers, wherein:
the first and second semiconductor layers are between first and second electrodes, the first semiconductor layer is between the first electrode and the active layer, the second semiconductor layer is between the second electrode and the active layer, the insulating layer surrounds side surfaces of the active layer and the first semiconductor layer and a first portion of the side surface of the second semiconductor layer, a second portion of the side surface of the second semiconductor layer extends over the insulating layer, and a width of the first electrode is wider than a width of the second electrode, and wherein:

the first electrode includes a stepped portion, the insulating layer is formed over the stepped portion, and a passivation layer is between the stepped portion of the first electrode and the insulating layer.

2. The light emitting device of claim 1, wherein the width of the first electrode is substantially equal to or greater than a width of the active layer.

3. The light emitting device of claim 1, wherein the second semiconductor layer is thicker than the first semiconductor layer.

4. The light emitting device of claim 1, wherein the first electrode has a central portion adjacent the stepped portion, and wherein the first and second semiconductor layers and the active layer are located over the central portion of the first electrode.

5. The light emitting device of claim 4, wherein:

the stepped portion is lower than the central portion, and the passivation layer is substantially coplanar with the central portion.

6. The light emitting device of claim 5, wherein the first semiconductor layer overlaps at least a portion of the passivation layer.

7. The light emitting device of claim 6, wherein the second semiconductor layer overlaps the insulating layer.

8. The light emitting device of claim 1, wherein the first electrode includes a reflective layer.

9. The light emitting device of claim 1, wherein the insulating layer includes at least one of $SiO_2$, $Si_3N_4$, $Al_2O_3$, or $TiO_2$.

10. The light emitting device of claim 1, wherein the insulating layer is formed continuously around the side surfaces of the active layer and at least one of the first or second semiconductor layer.

11. A light emitting device, comprising:

a first semiconductor layer of a first conductivity type;

a second semiconductor layer of a second conductivity type;

an active layer between the first and second semiconductor layers; and an insulating layer surrounding side surfaces of the active layer and at least one of the first or second semiconductor layers, wherein:

the first and second semiconductor layers are between first and second electrodes, the insulating layer surrounds side surfaces of the active layer and the first semiconductor layer and a first portion of the side surface of the second semiconductor layer, a second portion of the side surface of the second semiconductor layer extends over the insulating layer, the first electrode includes a stepped portion, and the insulating layer is formed over the stepped portion.

12. The light emitting device of claim 11, wherein the first electrode has a central portion adjacent the stepped portion, and wherein the first and second semiconductor layers and the active layer are located over the central portion of the first electrode.

13. The light emitting device of claim 12, wherein:

the stepped portion is lower than the central portion, and the insulating layer extends below the central portion.

14. The light emitting device of claim 13, wherein the insulating layer contacts the stepped portion of the first electrode.

15. A light emitting device, comprising:

a first semiconductor layer of a first conductivity type;

a second semiconductor layer of a second conductivity type;

an active layer between the first and second semiconductor layers; and an insulating layer surrounding side surfaces of the active layer and at least one of the first or second semiconductor layers, wherein the first and second semiconductor layers are between first and second electrodes, wherein a width of the first electrode is substantially equal to or greater than a width of the active layer, wherein the insulating layer is formed over the first electrode, wherein the second semiconductor layer is thicker than the first semiconductor layer, and wherein the first electrode includes a stepped portion, and the insulating layer is formed over the stepped portion.

16. The light emitting device of claim 15, wherein the insulating layer surrounds side surfaces of the active layer and the first and second semiconductor layers.

* * * * *